United States Patent [19]

Muraoka

[11] Patent Number: 5,681,398
[45] Date of Patent: Oct. 28, 1997

[54] SILICONE WAFER CLEANING METHOD

[75] Inventor: Hisashi Muraoka, Yokohama, Japan

[73] Assignees: Purex Co., Ltd.; Kabushiki Kaisha Toshiba, both of Japan

[21] Appl. No.: 405,876

[22] Filed: Mar. 17, 1995

[51] Int. Cl.$^6$ .................................. C23G 1/02; B08B 7/00
[52] U.S. Cl. .................. 134/3; 134/28; 134/33; 134/41; 510/175; 510/257
[58] Field of Search .................. 134/2, 3, 28, 33, 134/41; 252/142, 148, 541, 79.3, 79.4; 510/175, 426, 253, 256, 257, 405

[56] References Cited

U.S. PATENT DOCUMENTS

| | | | |
|---|---|---|---|
| 4,795,582 | 1/1989 | Ohmi et al. | 252/79.3 |
| 5,001,084 | 3/1991 | Kawai et al. | 134/33 X |
| 5,470,393 | 11/1995 | Fukazawa | 134/3 |

FOREIGN PATENT DOCUMENTS 6041770   9/1994   Japan.

*Primary Examiner*—Arlen Soderquist
*Assistant Examiner*—Saeed Chaudhry
*Attorney, Agent, or Firm*—Wenderoth, Lind & Ponack

[57] ABSTRACT

The present invention provides a method for cleaning a silicon wafer with a cleaning fluid, comprising 35 to 65% by weight of $HNO_3$, 0.05 to 0.5% by weight of HF, 0.05 to 0.5% by weight of HCl, 0.002 to 0.1% by weight of a surface-active agent, and water. The silicon wafer cleaning method involves comprising treating the surface of a silicon wafer with said cleaning fluid. According to the present method, etching of the silicon wafer surface can be carried out simply with the amount of the etching being controlled to several tens Å, and particularly about 20 to 30 Å, and without damage to the smoothness of the surface. In addition, contamination with gold and other heavy metals of the order of $10^{12}$ atoms/cm$^2$ can be decreased to not more than 1/100.

12 Claims, 2 Drawing Sheets

SILICONE WAFER CLEANING METHOD

BACKGROUND OF THE INVENTION

1. Field of the Invention

The present invention relates to a silicon wafer cleaning fluid that is useful, for example, in the process of producing semiconductor silicon wafers and in the process of producing semiconductor devices and to a silicon wafer cleaning method using said cleaning fluid.

2. Description of the Prior Art

As cleaning fluids that are widely used in removing intense contamination with heavy metal contaminants on the surface of semiconductor silicon wafers, for example, a fluid which consists of hydrochloric acid, hydrogen peroxide, and water and is called SC-2 (hereinafter referred to as SC-2) used in the RCA method, and oxidizing cleaning fluids, such as nitric acid and aqua regia, are known. The cleaning of silicon wafers using these cleaning fluids is generally carried out such that silicon wafers are supported by fluororesin carriers and are dipped in these cleaning fluids for a prescribed period. When silicon wafers are dipped in the above cleaning fluids, heavy metals on the silicon wafer surface are dissolved and removed. However, with respect to the effect of removing heavy metals by these cleaning fluids, the examination of the contamination with gold that is the least removed among heavy metals reveals that it is recognized that aqua regia and SC-2 are effective in cleaning intense contamination with gold amounting approximately to $10^{15}$ atoms/cm$^2$ or more, but the cleaning effect is not satisfactory if the contamination is not as high as this level and a cleaning effect can not be obtained if the contamination is on the order of $10^{13}$ atoms/cm$^2$ or below. This is because if the contamination is $10^{14}$ atoms/cm$^2$ or less, at the time of cleaning, a spontaneous oxide film is formed on the wafer surface and gold atoms are taken under the oxide film.

Therefore, it is desirable that while the spontaneous oxide film be removed such that an oxidizing agent can be effective. The present inventor proposed in Japanese Patent No. 613521 a cleaning fluid comprising 1 volume of aqua regia and 0.3 volume or less of HF as an agent for removing the spontaneous oxide film. According to the method described in the above patent, it is shown that contamination with gold amounting to $10^{15}$ atoms/cm$^2$ can be reduced by one cleaning treatment to $10^{10}$ atoms/cm$^2$. However, the etching action on the silicon wafer surface caused by the HNO$_3$ and HF is strong because it is facilitated by chlorine and nitrosyl chloride generated from the aqua regia and at a certain concentration of HF, this cleaning fluid etches the silicon wafer in an amount of 1 μm or more in some cases, and the fine indentations (haze) generated on the silicon wafer damages the specular state of the surface. If the cleaning is effected with the HF concentration of the cleaning fluid greatly lowered to an extent where haze will not be generated, because a small difference in the generated amount of nitrosyl chloride and chlorine causes the etching amount to vary considerably, the conditions of the cleaning become hard to control. Thus, this cleaning fluid is not suitable for the process of producing IC, LSI circuits, etc.

Therefore, where particularly intense contamination with heavy metals is required to be removed, a treatment of dissolving heavy metals with SC-2 or aqua regia and an etching treatment of removing the spontaneous oxide film with dilute hydrofluoric acid are alternately repeated. However, although this cleaning method can remove metals that can be easily oxidized, such as copper, the method cannot exhibit satisfactory cleaning effect on contamination with gold and, for example, even if the dilute hydrofluoric acid/SC-2 treatment is repeated 10 times, contamination with gold is reduced only to about ½.

On the other hand, in the process of producing semiconductor devices, there is a step of giving strong, though shallow defects to the silicon wafer surface, such as reactive ion etching (RIE) and ion implantation. Since generally heavy metals are high in diffusion speed, they penetrate easily into such a defect region and therefore, in that step, there is a fear that intense contamination with heavy metals will occur. Accordingly, for such contamination, there is required a cleaning fluid that can etch and remove the defect region itself. On the other hand, the etching should not damage the smoothness of the silicon wafer surface. Thus, a cleaning fluid and cleaning method that can control the etching to a thickness of several tens Å, and particularly about 20 to 30 Å, are required. This is because if the etching is to this extent, the smoothness is not damaged. Further to attain high productivity, desirably it is demanded that the cleaning can be carried out by simple contact treatment for a short period of about 1 min.

SUMMARY OF THE INVENTION

Therefore, an object of the present invention is to provide a silicon wafer cleaning fluid and a silicon wafer cleaning method that allow the silicon wafer surface to be etched simply with the etching amount controlled to about several tens Å and can remove or reduce gold and other heavy metals to $10^{10}$ atoms/cm$^2$ or less.

The present invention provides, as means of attaining the object, a silicon wafer cleaning fluid, comprising 35 to 65% by weight of HNO$_3$, 0.05 to 0.5% by weight of HF, 0.05 to 0.5% by weight of HCl, 0.002 to 0.1% by weight of a surface-active agent, and water. The present invention also provides a silicon wafer cleaning method, comprising the step of bringing the surface of silicon wafers into contact with the above cleaning fluid.

The silicon wafer cleaning fluid and method of the present invention allow the silicon wafer surface to be etched simply with the etching amount controlled to about several tens Å, and particularly about 20 to 30 Å, and without damaging the smoothness of the surface. In addition, contamination with gold and other heavy metals can be reduced to not more than 1/100. Since the level of contamination with heavy metals in the controlled process of producing very large scale integrated circuits is of the order of $10^{12}$ atoms/cm$^2$, this cleaning can reduce the level to $10^{10}$ atoms/cm$^2$ or less.

Further, the present silicon wafer cleaning fluid can adjust the etching speed and the etching amount by adjusting the composition of the cleaning fluid. For example, if the etching speed is adjusted to 20 to 30 Å per min and the cleaning time is adjusted, one operation of cleaning can bring the etching amount approximately to the above-mentioned 10 to 20 Å and even when the cleaning is repeated twice, a smoothness substantially satisfactory to the production of very large scale integrated circuits can be obtained.

Further, the present silicon wafer cleaning fluid can be used even at a temperature of 10° C. or below by choosing a composition without lowering the above cleaning effect. Accordingly, even in the case where the problem of contamination of the clean room working atmosphere with acids is taken into consideration, by using the above cleaning fluid at a temperature of 10° C. or below, acids can be substantially prevented from evaporating from the cleaning fluid.

Since the present silicon wafer cleaning fluid is very high in wettability for silicon wafers, the surface can be kept wet until the wafer is rinsed with pure water, and fine particles in the cleaning fluid are allowed little to adhere to the silicon wafer surface, which is advantageous in view of the measure against contamination with fine particles.

Since the present silicon wafer cleaning fluid hardly allows the wafer to be contaminated conversely with metal components in the cleaning fluid, the simple contact treatment of forming a thin layer of the cleaning fluid on the silicon wafer surface can achieve a satisfactory cleaning effect. As a result, said cleaning fluid can be used in an individual-wafer cleaning apparatus.

DETAILED DESCRIPTION OF THE INVENTION

Figure 1:
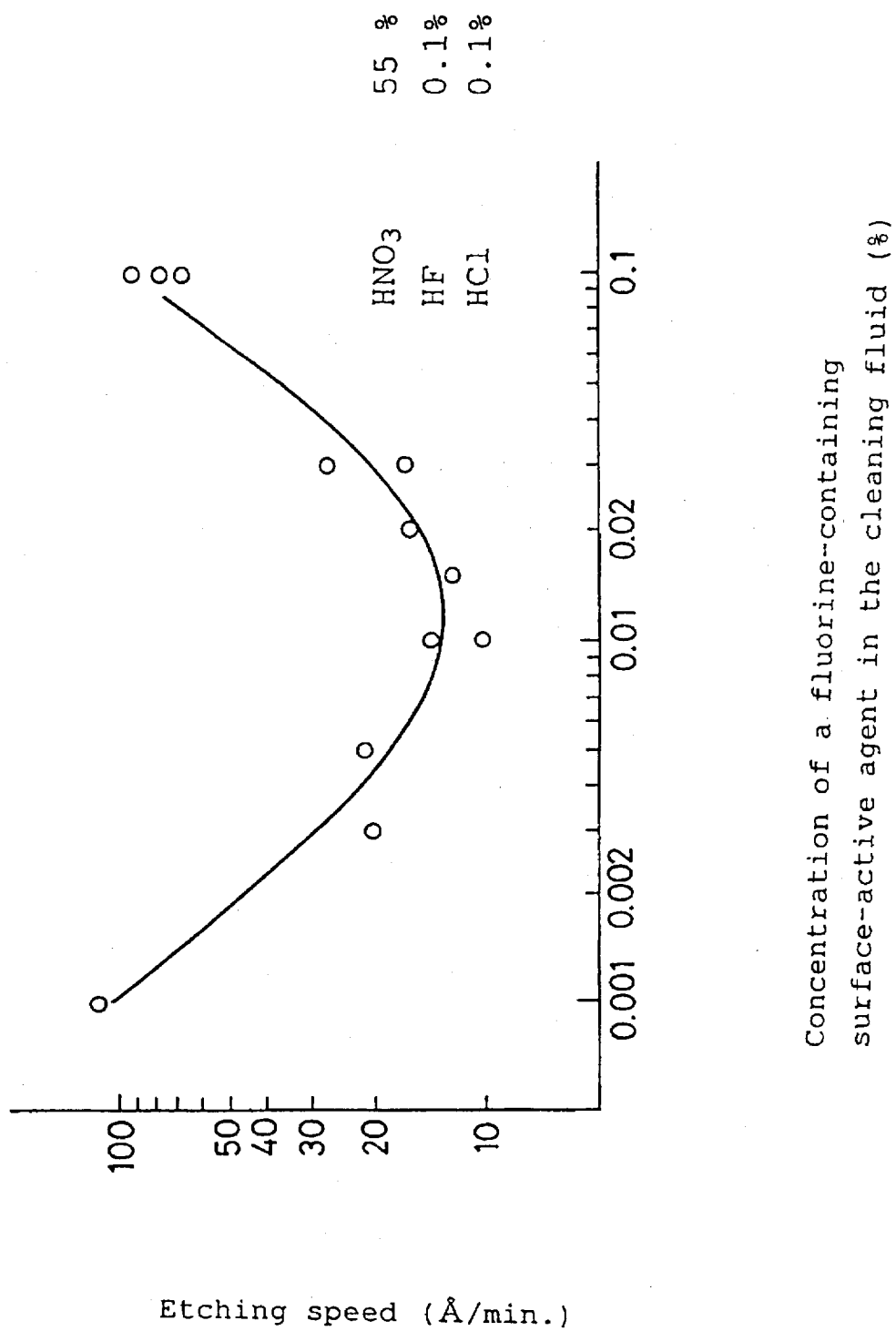
FIG. 1 is a graph showing the relationship obtained in Example 3 between the etching speed of the present cleaning fluid for P-type silicon wafers (crystal orientation: (100); and electric resistance: several Ω cm) and the concentration of a fluorine-containing surface-active agent contained in said cleaning fluid.

Now, the present invention will be described in detail.
Surface-Active Agents

As the surface-active agent, any of nonionic, amphoteric, and cationic surface-active agents can be used so long as the surface-active agent does not contain any metal components, is excellent in permeability and wetting power for silicon wafers, in other words, good in wettability, and good in chemical stability in oxidizing acid fluids. Specific examples include oxyethylene polyaddition products, such as polyoxyethylene alkyl ethers whose alkyl group has generally 8 to 18 carbon atoms and polyoxyethylene alkylphenol ethers whose alkyl group has generally 7 to 10 carbon atoms; imidazolinium betaine amphoteric surface-active agents; and fluorine-containing surface-active agents (e.g., perfluoroalkylamine oxides, which are nonionic, perfluoroalkylbetaines, which are amphoteric, and quaternary ammonium salts similar to perfluoroalkyltrimethylammoniums, which are cationic). More specifically, as an example of the oxyethylene polyaddition product, a polyoxyethylene nonylphenyl ether in which the molar number of ethylene oxide is about 10, and specifically 9 to 13, is preferably used. Among the above surface-active agents, fluorine-containing surface-active agents having, in the molecule, a perfluoroalkyl group whose alkyl group has generally 4 to 10 carbon atoms are most preferably used.

The concentration of the above surface-active agent in the cleaning fluid is 0.002 to 0.1% by weight, and preferably 0.002 to 0.05% by weight.
Acid Components The concentration of $HNO_3$ is 35 to 65% by weight, and preferably 45 to 55% by weight. On the one hand if the concentration of $HNO_3$ is less than 35% by weight, a satisfactory removing effect for Au cannot be secured unless the concentration of HF or HCl is over than 0.5% by weight and on the other hand if the concentration of $HNO_3$ is over 65% by weight, a hydrophilic abnormal film is liable to be formed on the wafer surface and the crystal completeness of the cleaned surface is difficult to control.

The concentration of HF is 0.05 to 0.5% by weight, and preferably 0.1 to 0.3% by weight. If the concentration of HF is less than 0.05% by weight, the removing effect for Au is lowered extremely while if the concentration of HF is over 0.5% by weight, it becomes difficult to control the etching amount, i.e., to secure the smoothness.

The concentration of HCl is 0.05 to 0.5% by weight, and preferably 0.1 to 0.3% by weight. If the concentration of HCl is less than 0.05% by weight, the removing effect for Au is lowered extremely while if the concentration of HCl is over 0.5% by weight, it becomes difficult to control the etching amount, i.e., to secure the smoothness.
Other Additives To the present silicon wafer cleaning fluid, may be added, for example, organic acids, such as acetic acid, in order to control the etching, and $Br_2$ or the like in order to strengthen the oxidizing power, which are added in the range where they do not damage the cleaning effect.
Preparation of the Cleaning Fluid In the present cleaning method, sometimes a certain way of preparing the cleaning fluid lowers the cleaning effect. The most preferred way of preparation is one wherein to an aqueous solution containing 55 to 70% by weight of nitric acid (concentrated nitric acid) are added an aqueous solution containing a calculated amount of hydrofluoric acid, an aqueous solution containing a calculated amount of hydrochloric acid, and an aqueous solution containing a calculated amount of a surface-active agent (the water used in each aqueous solution being pure water) in the stated order. However the order of the hydrofluoric acid and the hydrochloric acid to be added can be reversed. If the surface-active agent is added before the addition of the hydrofluoric acid or the hydrochloric acid, the cleaning effect is lowered. Even where the cleaning fluid is prepared in such a preferred way, after two hours, the cleaning effect of the cleaning fluid drops. Accordingly, it is desirable that the cleaning fluid be prepared in a raw material liquid mixing tank connected directly to the cleaning apparatus immediately before the cleaning is effected.

In the preparation, since satisfactory mixing is required in each step of the addition, the mixing preparation apparatus including the mechanism for weighing the raw material liquids becomes complicated and special care is needed for control. For this, a two-part-fluid mixing process is devised. According to this process, by only one mixing operation, a good cleaning effect and an etching amount with good reproducibility can be secured. The two-part-fluid mixing process is a process wherein the above four aqueous solutions (which may be in concentrated form or diluted form) are suitably combined and mixed to form two solutions (i.e., two part-fluids) and these two solutions are mixed to prepare a cleaning fluid when or just before the cleaning is carried out. Therefore, the present cleaning fluid may be provided in the form of two fluids, for example, a combination of an aqueous solution containing hydrochloric acid, hydrofluoric acid, and a surface-active agent with an aqueous solution of nitric acid (generally in the form of concentrated nitric acid). Alternatively the present cleaning fluid may be provided in the form of two fluids, one being an aqueous solution containing nitric acid (generally in the form of concentrated nitric acid) and hydrofluoric acid and one being an aqueous solution containing hydrochloric acid and a surface-active agent. The thus provided two fluids are mixed for use to prepared a cleaning fluid. Since these prepared fluids of the two-fluid type can be stored for a long period of time, they can be prepared in advance.

By adjusting the concentrations of the above acid components, the etching power for the silicon wafer as well as the etching speed can be adjusted. In the case wherein the concentration of $HNO_3$ is high, by lowering the concentrations of HCl and HF, and in the case wherein the concentration of $HNO_3$ is low, by increasing the concentrations of HCl and HF, the desired etching power can be obtained. Although the cleaning effect can be easily increased by increasing the concentration of $HNO_3$, environmental contamination by the $HNO_3$ atmosphere is liable to occur and therefore sufficient consideration is required for the exhaust mechanism. Therefore, in such a case wherein a large amount of the agent fluid is used for cleaning wafers by dipping, it is desirable to choose a composition in which the concentration of $HNO_3$ is low. Where the temperature of the treatment fluid is lowered to 10° C. or below, since the evaporation of $HNO_3$ can be suppressed, the environmental contamination can be reduced considerably even if the cleaning effect is increased by increasing the concentration of $HNO_3$.

Cleaning of Silicon Wafers

The cleaning of silicon wafers by the present cleaning fluid comprises bringing the silicon wafer into contact with said cleaning fluid. Heavy metals on the silicon wafer are dissolved in the cleaning fluid to be removed. Generally, desired cleaning is attained by bringing the silicon wafer in contact with the cleaning fluid for about 30 sec to 3 min. Specifically, by choosing a composition of the cleaning fluid, and bringing the silicon wafer in contact with the present cleaning fluid, for example, for about 1 min, the contamination of gold, copper, iron, and other heavy metals can be reduced to not more than $1/100$, compared with that prior to cleaning, and if this cleaning is repeated twice succesively, the contamination can be reduced to not more than $1/1000$. The contact (cleaning) temperature of the cleaning is about 0°–30° C., and preferably about 5°–25° C. Even if the contact temperature is lower than 10° C., a satisfactory cleaning effect can be obtained as shown in Example 5 given below.

The heavy metals dissolved in the present cleaning fluid are less adsorbed reversely onto the silicon wafer. For example, even if the concentration of copper in the cleaning fluid reaches 100 ppb, the adsorption onto the silicon wafer is of the order of $10^8$ atoms/cm$^2$. Therefore, a satisfactory cleaning effect can be obtained by covering the silicon wafer only with a quite thin fluid layer of the cleaning fluid having, for example, a thickness of 0.1 to 1 mm.

Since the present cleaning fluid contains a surface-active agent, the cleaning fluid is quite high in wettability for silicon wafers, and therefore the whole surface of the wafer can be covered with a thin fluid layer as mentioned above. Specifically, for example, similarly to the spin coating method, a silicon wafer is rotatably held horizontally, and while the silicon wafer is spun with being kept horizontal, the present cleaning fluid is dropped little by little on the surface of the silicon wafer, so that the whole surface of the wafer can be covered with the layer of the fluid (for instance, in the case of 6-inch silicon wafers, it is recommended that 10 to 20 cc of the cleaning fluid be dropped). It is possible that said silicon wafer surface is covered uniformly with said cleaning fluid for a prescribed period and then successively is rinsed with pure water, and the rotational frequency is increased to dry the silicon wafer surface by centrifuging so that a series of cleaning treatments may be carried out (which is a so-called paddle treatment). The drying may be carried out by blowing a clean atmosphere across the surface of the wafer. Alternatively, a series of steps for cleaning can be carried out such that the silicon wafer is held vertically, the cleaning fluid is applied by pouring or spraying from above to form a quite thin fluid layer of the cleaning fluid on the silicon wafer surface, the silicon wafer is allowed to stand for a prescribed period of time and is then rinsed with pure water, and a warmed clean atmosphere is blown onto the silicon wafer surface. Also, the conventional dipping method can be applied, and in that case the silicon wafer is dipped in the cleaning fluid and is then immediately pulled out.

Generally, when a silicon wafer is cleaned with a cleaning fluid and becomes dry once before rinsing with pure water, fine particles in the cleaning fluid adhere firmly to a dry region on the silicon wafer and it becomes very difficult to remove those fine particles with pure rinsing water. However, the present cleaning fluid is high in wettability for silicon wafers and it is seldom that the silicon wafer becomes dry before it is rinsed with pure water. Particularly, the cleaning fluid that contains a fluorine-containing surface-active agent is high in wettability, and for example if only 0.01% of said surface-active agent is added, the silicon wafer can be brought to the pure water rising treatment with almost all the surface of the silicon wafer being kept wet, and if 0.02% of said surface-active agent is added, positive wettability can be secured. Even in the case wherein a hydrocarbon type surface-active agent is added, if the hydrocarbon type surface-active agent is added in an amount twice the amount of a fluorine-containing surface-active agent, satisfactory wettability of the cleaning fluid can be obtained.

In the present cleaning fluid, the addition of a small amount of HF to the main agent, $HNO_3$, allows the silicon wafer surface to be etched without a spontaneous oxide film being formed, and although the amount of HCl to be added is very small, nitrosyl chloride enough to dissolve and remove metal contaminants on the wafer surface can be generated.

While nitrosyl chloride promotes etching, the added surface-active agent acts to suppress the etching and also the addition of a suitable small amount of the surface-active agent controls the generation of nitrosyl chloride to the necessary and sufficient amount. Thus, the speed of etching the silicon wafer is controlled to about 20 to 30 Å/min, so that the smoothness of the cleaned wafer surface is not damaged.

EXAMPLES

Examples of the present invention will now be given below. The present invention is not limited by the following Examples at all.

In each of the Examples, % in the composition of the cleaning fluid (aqueous solution) is % by weight. Unless otherwise stated, the preparation of the cleaning fluid according to the present invention was carried out such that to nitric acid were added hydrofluoric acid, hydrochloric acid, and a surface-active agent in this order. Further, the cleaning was carried out such that a fluid layer of the cleaning fluid having a prescribed thickness was formed on the silicon wafer by the casting method as mentioned above and retained for a prescribed period.

The cleaning effect of the present invention was confirmed by the tracer method using a radioisotope element (RI). For example, to confirm the cleaning effect on contamination with gold, $^{198}Au$ was used as a label element, the radiation counts of $^{198}Au$ on the silicon wafer before and after the cleaning were compared, the cleaning effect was studied by finding the ratio of the radiation of gold adhered to the silicon wafer after cleaning to the radiation of gold adhered to the silicon wafer before the cleaning (hereinafter referred to as the residual ratio (in %)). For contamination with copper and contamination with iron, $^{64}Cu$ and $^{59}Fe$ were used as label elements respectively, and similarly the cleaning effect was studied.

In the following, $^{198}$AU, $^{64}$Cu and $^{59}$Fe indicate gold, copper and iron labeled with $^{198}$Au, $^{64}$Cu and $^{59}$Fe respectively. The term "cleaning time" means the period wherein the fluid layer of the cleaning fluid was retained.

Example 1

A P-type semiconductor silicon wafer (electric resistance: several Ω cm; and crystal orientation: (100)) contaminated with $^{198}$Au in an amount of about $10^{13}$ atoms/cm$^2$ was cleaned with a cleaning fluid (aqua regia or SC-2) that was conventionally considered to have a strong dissolving action on gold metal or a cleaning fluid of the present invention (the thickness of the fluid layer: about 1 mm), and the $^{198}$Au residual ratios after the cleaning were compared. The results are shown in Table 1.

TABLE 1

| Cleaning fluid | Composition | | Cleaning fluid temperature | Each cleaning time | Residual ratio after cleaning |
|---|---|---|---|---|---|
| Aqua regia | 37% hydrochloric acid | 3 volumes | 30° C. | 10 min | (A) 52% |
| | 70% nitric acid | 1 volume | | | (B) 45% |
| SC-2 | 37% hydrochloric acid | 1 volume | 70° C. | 10 min | (A) 72% |
| | 30% hydrogen peroxide | 1 volume | | | (B) 65% |
| | pure water | 5 volumes | | | |
| Cleaning fluid of the present invention | HNO$_3$ | 55% | 20° C. | 1 min | (A) 0.6% |
| | HF | 0.1% | | | (B) 0.02% |
| | HCl | 0.1% | | | |
| | perfluoroalkylamine oxide | 0.006% | | | |
| | pure water | balance | | | |

In Table 1, (A) shows the $^{198}$Au residual ratio after the first cleaning and (B) shows the $^{198}$Au residual ratio after the second cleaning. In the case wherein aqua regia or SC-2 was used, immediately after the first cleaning, the silicon wafer was treated with dilute hydrofluoric acid (HF: H$_2$O=1:10) and then the second cleaning was carried out (the thickness of the fluid layer: about 6 mm). On the other hand, in the case wherein the cleaning fluid of the present invention was used, the silicon wafer was not treated with diluted hydrofluoric acid, and after the rising with pure water, the second cleaning was carried out.

From the results of this Example, it is understood that, in the cleaning with aqua regia or SC-2, if the silicon wafer surface was cleaned twice successively, the contamination with gold was reduced at most only to a residual ratio of 45%. In contrast, in the case wherein the cleaning fluid of the present invention was used, it was confirmed that even where the contamination with gold on the silicon wafer was $10^-$ atoms/cm$^2$, the residual ratio after the first cleaning was 0.6%, i.e., the ratio was of the order of $10^{10}$ atoms/cm$^2$ and by the second successive cleaning, the residual ratio could be brought to 0.02%, i.e., the ratio could be brought to the order of $10^9$ atoms/cm$^2$. Further it was confirmed that the cleaning time in the case of the cleaning fluid of the present invention was as short as 1 min.

Example 2

The cleaning effects of a cleaning fluid not containing a surface-active agent and a cleaning fluid containing a surface-active agent were comparatively studied by cleaning P-type semiconductor silicon wafers (electric resistance: several Ω cm; and crystal orientation: <100>) contaminated with $^{198}$Au in an amount of about $10^{12}$ atoms/cm$^2$. The silicon wafer was cleaned five times with the cleaning fluid having the composition shown in Table 2 (the thickness of the fluid layer: 0.5 to 1 mm), thereby the stability of the cleaning effect was studied. The concentrations of the acids in each of the cleaning fluids in Table 2 were adjusted concentrations where the etching amount for the silicon wafer became 15 Å on average when the cleaning was effected at room temperature (20° C.) for 1 min. The results are shown in Table 2.

From Table 2, it could be confirmed that the cleaning effect of the cleaning fluid not containing a surface-active agent is unstable and difficult to control while the cleaning effect of any of the cleaning fluids of the present invention is stable where certain surface-active agents are used although there is a little difference in cleaning effect depending on the type of the surface-active agent used. It was also confirmed that the cleaning fluid containing a surface-agent having a perfluoroalkyl group whose alkyl group having 8 carbon atoms in the molecule is particularly high in cleaning effect and stable in cleaning effect. These results show that the results of cleaning obtained by the present invention are not scattered and are high in reliability.

TABLE 2

| Cleaning fluid No. | Composition of acids of cleaning fluid (%) | | | Type and concentration of surface active agent | Residual ratio after cleaning (%) |
|---|---|---|---|---|---|
| | HNO$_3$ | HCl | HF | | |
| 201 | 55 | 0.1 | 0.03 | — | first: 0.5 second: 3.5 third: 1.8 fourth: 4.0 fifth: 1.2 |
| 202 | 55 | 0.1 | 0.1 | polyoxyethylene nonylphenyl ether, 0.01% | first: 1.0 second: 1.1 third: 1.0 fourth: 0.8 fifth: 0.9 |
| 203 | 55 | 0.1 | 0.1 | imidazolinium betaine, 0.01% | first: 1.9 second: 1.7 third: 1.6 fourth: 1.5 fifth: 1.9 |
| 204 | 55 | 0.1 | 0.1 | perfluoroalkyl quaternary ammonium salt, 0.01% | first: 0.5 second: 0.4 third: 0.6 fourth: 0.5 fifth: 0.7 |

Example 3

In a cleaning fluid of the present invention where the composition of the acid components were made up of 55% of HNO$_3$, 0.1% of HF, and 0.1% of HCl, the concentration of a surface-active agent, a perfluoroalkyl quaternary ammonium salt whose alkyl group has 6 carbon atoms, was varied to prepare several cleaning fluids, and with respect to each of the thus prepared cleaning fluids, the etching speed at 25° C. was determined. The silicon wafers that were cleaned were P-type semiconductor silicon wafers (electric resistance: several Ω cm; and crystal orientation: (100)). The cleaning was carried out at 25° C. for 1 min. The thickness of the fluid layer was about 1 mm. The results are shown in FIG. 1.

FIG. 1 shows that in order to prepare a cleaning fluid having an etching speed of about 20 to 30 Å/min suitable for cleaning silicon wafers, it is desirable to bring the concentration of the surface-active agent in the cleaning fluid to fall in the range of 0.002 to 0.05%.

Example 4

In a cleaning fluid of the present invention that contained 0.02% of a perfluoroalkylbetaine whose alkyl group had 7 carbon atoms, the concentrations of the acid components were varied to study the cleaning effect for $^{198}$Au contamination (the thickness of the fluid layer: about 1 mm). The results are shown in Table 3. The $^{198}$Au residual ratio in Table 3 was obtained by cleaning $^{198}$Au contamination ($10^{12}$ atoms/cm$^2$) on P-type semiconductor silicon wafers (electric resistance: several Ω cm; and crystal orientation: (100)) with each of the cleaning fluids made at 25° C. for 40 sec.

TABLE 3

| Cleaning fluid No. | Composition of cleaning fluid (%) | | | | Residual ratio of $^{198}$Au after cleaning (%) |
| --- | --- | --- | --- | --- | --- |
| | HNO$_3$ | HF | HCl | Surface active agent | |
| 401 | 65 | 0.4 | 0.1 | 0.02 | 0.2 |
| 402 | 60 | 0.4 | 0.1 | 0.02 | 0.6 |
| 403 | 55 | 0.4 | 0.1 | 0.02 | 0.8 |
| 404 | 50 | 0.4 | 0.1 | 0.02 | 3.1 |
| 405 | 45 | 0.4 | 0.1 | 0.02 | 5.2 |
| 406 | 40 | 0.4 | 0.1 | 0.02 | 17 |
| 407 | 35 | 0.4 | 0.1 | 0.02 | 46 |
| 408 | 45 | 0.4 | 0.4 | 0.02 | 3.8 |
| 409 | 35 | 0.5 | 0.5 | 0.02 | 4.2 |
| 410 | 65 | 0.05 | 0.5 | 0.02 | 0.6 |
| 411 | 65 | 0.4 | 0.05 | 0.02 | 1.3 |

From Table 3, it can be understood that where the concentration of HNO$_3$ is increased, the cleaning effect on $^{198}$Au is also increased, and if the concentration of HNO$_3$ is low, by increasing the concentration of HF or HCl a satisfactory cleaning effect can be obtained.

Example 5

In the cases wherein the temperature of the cleaning fluid of the present invention was 10° C. or below (the thickness of the fluid layer: about 1 mm), the cleaning effect on $^{198}$Au contamination in an amount of $10^{12}$ atoms/cm$^2$ on N-type semiconductor silicon wafers (electric resistance: several Ω cm; and crystal orientation: (100)) was studied. The results are shown in Table 4. The surface-active agent used was a perfluoroalkyl quaternary ammonium salt whose alkyl group had 8 carbon atoms. The cleaning was carried out for 40 sec.

TABLE 4

| Cleaning fluid No. | Composition of cleaning fluid (%) | | | | Residual ratio of $^{198}$Au After cleaning (%) | |
| --- | --- | --- | --- | --- | --- | --- |
| | HNO$_3$ | HF | HCl | Surface active agent | 5° C. | 10° C. |
| 501 | 55 | 0.1 | 0.1 | 0.02 | 7.5 | 4.8 |
| 502 | 55 | 0.2 | 0.1 | 0.02 | 4.1 | 2.1 |
| 503 | 55 | 0.2 | 0.2 | 0.02 | 2.2 | 1.0 |
| 504 | 55 | 0.3 | 0.2 | 0.02 | 1.0 | 0.6 |

From Table 4, it can be understood that if the temperature of the cleaning is lowered to below 10° C., only by increasing the concentrations of HF and HCl a little, the cleaning fluid can provide a satisfactory cleaning power. In addition, the concentration of HNO$_3$ in the clean booth where the cleaning was carried out at 5° C. was the almost same as that in the clean room adjacent to the clean room, that is, the concentration of HNO$_3$ in the clean booth was 1 ppb or below. In contrast, in the case where the same cleaning was carried out at 25° C., the concentration of HNO$_3$ in the clean booth reached 18 ppb and therefore sufficient exhaustion was required.

Example 6

In the preparation of the cleaning fluid of the present invention, the order of the addition of raw material liquids to nitric acid was varied and the influence of the cleaning effect of that cleaning fluid on $^{198}$Au contamination ($10^{12}$ atoms/cm$^2$) on N-type semiconductor silicon wafers (electric resistance: several Ω cm; and crystal orientation: (100)) was examined. The cleaning fluid was composed of 55% of HNO$_3$, 0.1% of HF, 0.1% of HCl, 0.02% of a surface-active agent. The surface-active agent was a perfluoroalkyl quaternary ammonium salt whose alkyl group had 8 carbon atoms. The cleaning (the thickness of the cleaning fluid: about 1 mm) was carried out at 20° C. for 1 min. The results are shown in Table 5. The cleaning fluid Nos. 601 and 602 marked with * were preferable modes of the present invention.

TABLE 5

| Cleaning fluid No. | Order of addition to nitric acid | Residual ratio of $^{198}$Au after cleaning (%) |
| --- | --- | --- |
| 601* | hydrofluoric acid, hydrochloric acid, and surface active agent | 0.4 |
| 602* | hydrochloric acid, hydrofluoric acid, and surface active agent | 0.5 |
| 603 | surface active agent, hydrofluoric acid, and hydrochloric acid | 4.4 |
| 604 | surface active agent, hydrochloric acid, and hydrofluoric acid | 3.3 |
| 605 | hydrofluoric acid, surface active agent, and hydrochloric acid | 2.5 |
| 606 | hydrochloric acid, surface active agent, and hydrofluoric acid | 1.4 |

The addition of these components was carried out such that after the first addition, stirring was well performed, then the second addition was carried out, stirring was well performed, and the third addition was performed, followed by stirring well. It can be understood that where the addition of a surface active agent precedes the addition of hydrofluoric acid or hydrochloric acid, the cleaning effect is lowered a little.

Example 7

Fluid A and Fluid B shown in Table 6 were prepared separately, then they were mixed for use to prepare the cleaning fluids of the present invention, and the cleaning effect of the cleaning fluids was studied. The cleaning effect of the cleaning fluids on $^{198}$Au contamination ($10^{12}$ atoms/cm$^2$) on an N-type semiconductor silicon wafer (electric resistance: several Ω cm; and crystal orientation: (100)) and the etching amount by the cleaning fluids were studied. The cleaning (the thickness of the fluid layer: about 1 mm) was carried out at 20° C. for 1 min. The surface-active agent used was a perfluoroalkyl quaternary ammonium salt whose alkyl group had 9 carbon atoms.

TABLE

| | Composition before mixing (%) | | | Residual ratio | |
|---|---|---|---|---|---|
| | Fluid A: 78 volumes | Fluid B: 22 volumes | Composition after mixing (%) | of $^{198}$Au after cleaning (%) | Etching amount (Å) |
| Preparation Example 1 | HNO$_3$ (70)* | HF (0.45) HCl (0.45) surface-active agent (0.09) | HNO$_3$ (55) HF (0.1) | 0.5 | 18 |
| Preparation Example 2 | HNO$_3$ (70)* HF (0.13) | HCl (0.45)* surface-active agent (0.09) | HCl (0.1) surface-active agent (0.02) | 0.4 | 17 |

(Note) *The balance was water.

The compositions of the cleaning fluids and the cleaning conditions of this Example are the same as those of Example 6 and it can be understood that the cleaning effect by this two-fluid mixing method is not different from the best cleaning effect of Example 6 where the components were added successively and that the etching amount is controlled well.

Example 8

After such a treatment as reactive ion etching and ion implantation, since crystal defects are formed on the silicon wafer surface, sometimes it is necessary to etch the surface to several tens Å or more to remove said defects. The lowering of the smoothness of the silicon wafer surface formed by such etching are caused in many cases due to the difference in etching speed by the cleaning fluid depending on the crystal orientation. Therefore, two types of silicon wafers different in crystal orientation, i.e., an N-type semiconductor silicon wafer (electric resistance: several Ω cm; and crystal orientation: (100)) (hereinafter referred to as (100)) and an N-type semiconductor silicon wafer (electric resistance: several Ω cm; and crystal orientation: (111)) (hereinafter referred to as (111)) were cleaned with the present cleaning fluid (composed of 55% of HNO$_3$, 0.1% of HF, 0.1 of HCl, and 0.02% of a perfluoroalkyldimethylhydroxyethyl quaternary ammonium salt whose alkyl group had 8 carbon atoms) and the etched amounts of the silicon wafer surfaces after the cleaning were compared. The cleaning (the thickness of the fluid layer: about 1 mm) was carried out at 25° C. for 10 min.

The etched amounts of the (100) and the (111) were scattered between 120 Å and 180 Å and there was no significant difference between them. From this Example, it can be confirmed that the etching action of the present cleaning fluid is not affected by the crystal orientation of the silicon wafer.

Example 9

The adsorption of $^{198}$Au onto the silicon wafer surface from the cleaning fluid of the present invention was determined with the concentration of $^{198}$Au varied in the cleaning fluid. The thickness of the fluid layer was about 1 mm. The results are shown in FIG. 2.

Figure 2:
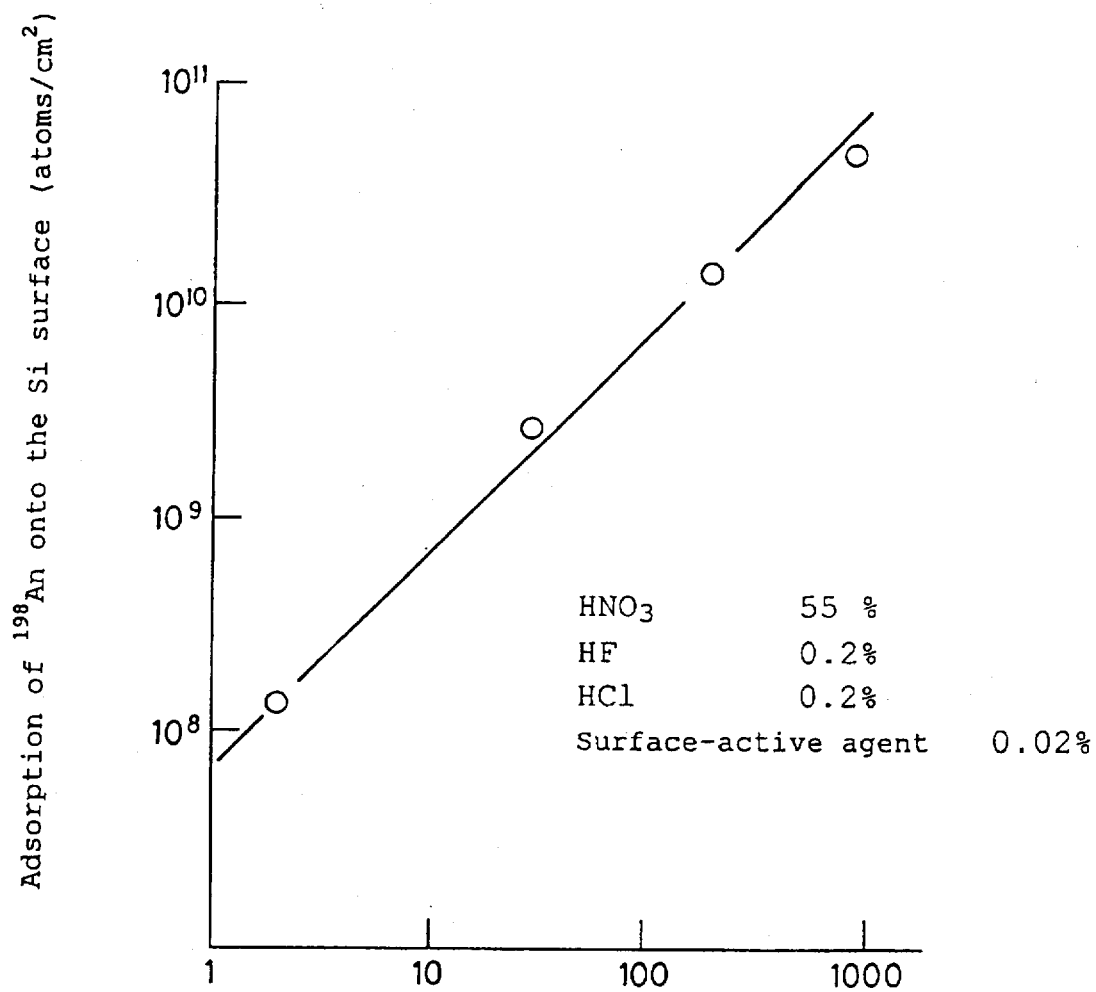
FIG. 2 is a graph showing the relationship obtained in Example 9 between the $^{198}$Au concentration of the cleaning fluid and the adsorption of $^{198}$Au onto the silicon wafer onto the cleaning fluid.

From FIG. 2, it can be understood that if there is gold at a higher concentration in the present cleaning fluid, the amount of gold in the cleaning fluid which will be adsorbed onto the silicon wafer is quite small.

Example 10

In a laboratory device having a structure similar to the spin coater for photoresist, a 6-inch silicon wafer only one surface of which was contaminated with $^{198}$Au in an amount of $10^{12}$ to $10^{13}$ atoms/cm$^2$ was set so that the contaminated surface was upward while the silicon wafer was rotated, about 5 cc of a cleaning fluid containing 55% of HNO$_3$, 0.2% of HF, 0.2% of HCl, and 0.02% of a polyoxyethylene alkylnonyl ether whose alkyl group had 9 carbon atoms was dropped to be spread throughout the silicon wafer, then the rotation was stopped and the silicon wafer was allowed to stand for 1 min. The thickness of the fluid layer at that time was about 0.5 mm. Thereafter the silicon wafer was rotated again while pure water was poured to rinse the silicon wafer for 30 sec, and then after the silicon wafer was rotated at a higher speed to be dried, the $^{198}$Au residual ratio on the silicon wafer surface was determined. With respect to a 6-inch silicon wafer contaminated with $^{64}$Cu or $^{59}$Fe, similarly the cleaning was carried out, and the $^{64}$Cu or $^{59}$Fe residual ratio was found. The results showed that the $^{198}$Au residual ratio was 0.6%, the $^{64}$Cu residual ratio was 0.2%, and the $^{59}$Fe residual ratio was 0.1% or less.

Additionally, in the case where the above drying was carried out by blowing clean nitrogen, good results, similar to the above results, of the removal of $^{198}$Au, $^{64}$Cu, and $^{59}$Fe contamination were obtained.

Example 11

A silicon wafer contaminated similarly to Example 9 with $^{198}$Au, $^{64}$Cu, or $^{59}$Fe was held approximately vertically and the same cleaning fluid as that of Example 9 was sprayed from above onto the silicon wafer surface. After confirming that the whole surface of the silicon wafer was wetted with the cleaning fluid, the silicon wafer was allowed to stand for 1 min (at that time the thickness of the fluid layer was about 0.5 mm), the silicon wafer rinsed with pure water, and high-purity air that had been subjected to microfiltration was blown to dry the silicon wafer. The heavy metal residual ratios of the silicon wafer surfaces were determined and the $^{198}$Au residual ratio was 0.4%, the $^{64}$Cu residual ratio was 0.2%, and the $^{59}$Fe residual ratio was 0.1% or less.

What is claimed is:

1. A silicon wafer cleaning method, comprising bringing a fluid for cleaning silicon wafers consisting essentially of 35 to 65% by weight of $HNO_3$, 0.05 to 0.5% by weight of HF, 0.05 to 0.5% by weight of HCl, 0.002 to 0.1% by weight of a surface-active agent, and water in contact with the silicon wafer surface, said fluid having been prepared by mixing the components in a manner such that said surface active agent is not added to the $HNO_3$ and water before the addition of aqueous HF or aqueous HCl to the $HNO_3$ and water, said contact occurring within 2 hours from the preparation of said fluid.

2. The silicon wafer cleaning method of claim 1, wherein said surface-active agent comprises a compound having a perfluoroalkyl group in the molecule.

3. The silicon wafer cleaning method of claim 1, wherein the contact temperature is 0° to 30° C.

4. The silicon wafer cleaning method of claim 3, wherein the contact temperature is 10° C. or below.

5. The silicon wafer cleaning method of claim 1, wherein said contact is carried out by covering the whole surface of the silicon wafer with a fluid layer of said cleaning silicon wafer cleaning fluid.

6. The silicon wafer cleaning method of claim 5, wherein the thickness of the fluid layer is 0.1 to 1 mm.

7. The silicon wafer cleaning method of claim 5, wherein the fluid layer is formed by dropping said fluid for cleaning silicon wafers on the surface of a silicon wafer that is spun in a horizontal plane.

8. The silicon wafer cleaning method of claim 5, wherein the fluid layer is formed by pouring and casting said silicon wafer cleaning fluid on the surface of the silicon wafer that is held vertically.

9. The silicon wafer cleaning method of claim 5, wherein the fluid layer is formed by spraying said silicon wafer cleaning fluid onto the surface of the silicon wafer that is held vertically.

10. The silicon wafer cleaning method of claim 1, further comprising rinsing with pure water.

11. The silicone wafer cleaning method of claim 1, where said surface-active agent is a fluorine-containing surface active agent.

12. A silicon wafer cleaned by a cleaning method which comprises bringing a fluid consisting essentially of 35 to 65% by weight of $HNO_3$, 0.05 to 0.5% by weight of HF, 0.05 to 0.5% by weight of HCl, 0.002 to 0.1% by weight of a surface-active agent, and water in contact with the silicon wafer surface, said fluid having been prepared by mixing the components in a manner such that said surface active agent is not added to the $HNO_3$ and water before the addition of aqueous HF or aqueous HCl to the $HNO_3$ and water, said contact occurring within 2 hours from the preparation of said fluid.

* * * * *